(12) United States Patent
Tomono et al.

(10) Patent No.: US 9,571,057 B2
(45) Date of Patent: Feb. 14, 2017

(54) ALTERING AUDIO SIGNALS

(71) Applicant: FUJITSU LIMITED, Kawasaki-shi, Kanagawa (JP)

(72) Inventors: Mitsuru Tomono, San Jose, CA (US); Naomi Hadatsuki, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 364 days.

(21) Appl. No.: 13/791,547

(22) Filed: Mar. 8, 2013

(65) Prior Publication Data

US 2014/0254830 A1 Sep. 11, 2014

(51) Int. Cl.
*H03G 3/00* (2006.01)
*H03G 3/30* (2006.01)
*H04R 1/10* (2006.01)

(52) U.S. Cl.
CPC .......... *H03G 3/3089* (2013.01); *H03G 3/3005* (2013.01); *H04R 1/1041* (2013.01); *H04R 2430/01* (2013.01)

(58) Field of Classification Search
CPC .......... H03G 3/32; H03G 3/20; H03G 3/3005; H04R 2430/01

USPC .................................................... 381/57, 107

See application file for complete search history.

(56) References Cited

U.S. PATENT DOCUMENTS

| | | | |
|---|---|---|---|
| 2008/0079571 A1* | 4/2008 | Samadani | 340/552 |
| 2010/0076793 A1* | 3/2010 | Goldstein | G06F 21/10 705/4 |
| 2010/0151887 A1* | 6/2010 | Bobier | 455/457 |
| 2012/0071997 A1* | 3/2012 | Aliakseyeu et al. | 700/94 |
| 2012/0274498 A1* | 11/2012 | Hyde | G01S 13/86 342/28 |
| 2013/0243235 A1* | 9/2013 | Clayton et al. | 381/371 |
| 2014/0044269 A1* | 2/2014 | Anderson | 381/57 |

* cited by examiner

*Primary Examiner* — Rasha Al Aubaidi
(74) *Attorney, Agent, or Firm* — Maschoff Brennan (57) ABSTRACT

A system of altering an audio signal presented to a user may include an input configured to receive data indicating a status of an environment outside of an audio device, where the audio device is configured to present an audio signal to a user. The system may also include a detection unit configured to detect a condition based on the received data and an audio altering unit configured to direct altering of the audio signal presented to the user based on the detection of the condition.

7 Claims, 5 Drawing Sheets

ALTERING AUDIO SIGNALS

FIELD

The embodiments discussed herein are related to altering audio signals.

BACKGROUND

Personal audio devices, such as headphones, music players, and mobile phones, are becoming more and more popular and are being used during more activities. While using personal audio devices, however, users may become somewhat isolated from their immediate environment because they cannot hear sounds in their immediate environment. A user's isolation from their immediate environment may be increased when the audio device provides active noise canceling that reduces the level of sound presented to the user from the immediate environment and not from the audio device.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a system of altering an audio signal presented to a user may include an input configured to receive data indicating a status of an environment outside of an audio device, where the audio device is configured to present an audio signal to a user. The system may also include a detection unit configured to detect a condition based on the received data and an audio altering unit configured to direct altering of the audio signal presented to the user based on the detection of the condition.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments described herein relate to systems and methods of altering an audio signal presented to a user by an audio device based on a status of an external environment of the audio device and the user. In particular, some embodiments described herein relate to detecting a status of an external environment surrounding a user of an audio device. The status of the external environment may include the position and other information about one or more objects within the external environment surrounding the user. An altering device, which may be included in the audio device, may receive data indicating the status of the external environment and detect if certain conditions exist within the external environment surrounding the user. For example, the altering device may detect if objects within the external environment are within a particular threshold distance of the user. When the altering device detects that a condition exists, the altering device may alter the audio signal presented to the user or direct the altering of the audio signal presented to the user to allow the user to be alerted to the detected conditions.

In some embodiments, the audio signal may be altered by reducing the volume of the audio signal so that a user may hear sounds from the external environment surrounding the user. In some embodiments, the audio signal presented to the user may be altered by replacing the audio signal with a second audio signal or adding the second audio signal to the audio signal. The second audio signal may be a pulse, a beep, a message, or some other audio signal that may be recognized by the user as indicating that a condition exists in the surrounding environment. In some embodiments, the audio signal may be altered by eliminating a noise cancellation function of the audio device so that sounds from the external environment may be more easily heard by the user.

Embodiments of the present invention will be explained with reference to the accompanying drawings.

Figure 1:
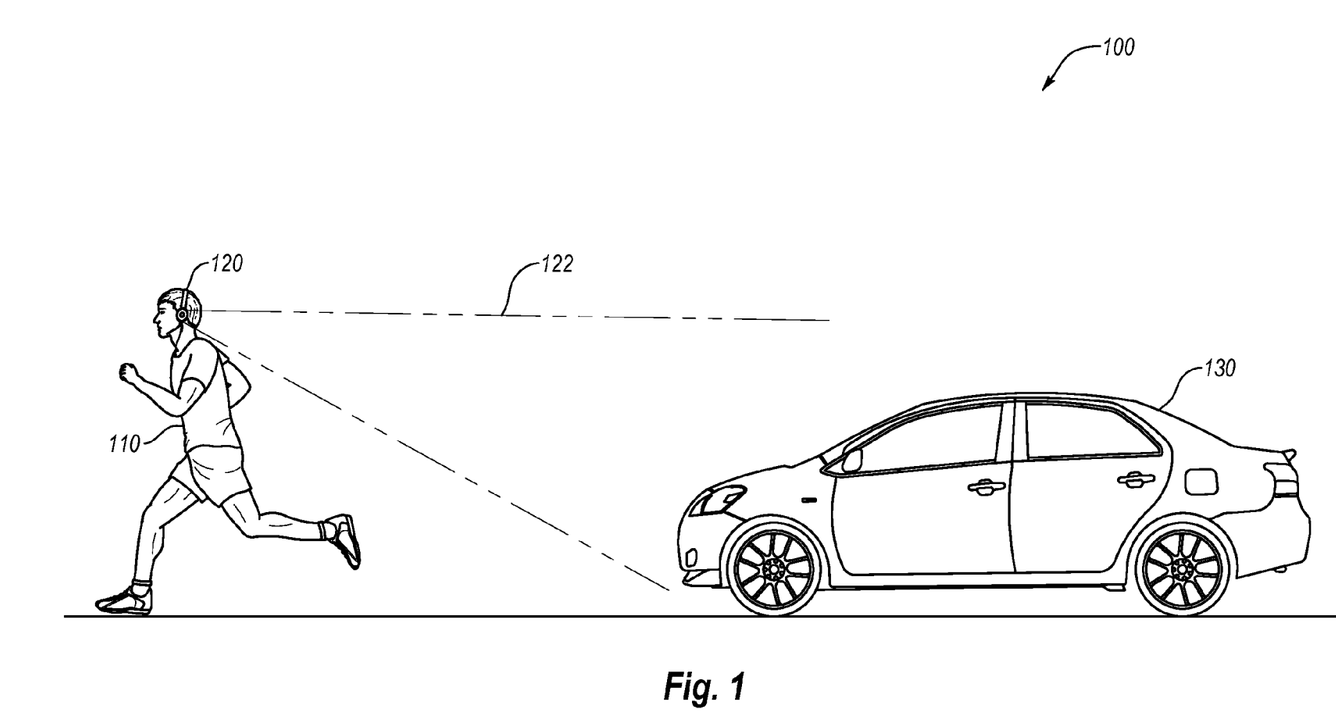
FIG. 1 illustrates an example operating environment in which an audio signal presented to a user may be altered based on an external environment.

FIG. 1 illustrates an example operating environment in which an audio signal presented to a user 110 may be altered based on an external environment 100, arranged in accordance with at least one embodiment described herein. The audio signal may be presented to the user 110 by a system 120, depicted in FIG. 1 as a pair of headphones. In other embodiments, the system 120 may be a mobile device, such as an mp3 player or other media player, a gaming console, a mobile phone, or a tablet or some part of a non-mobile device, such as a desktop computer. The audio signal presented to the user 110 by the system 120, may include music, voice communications, radio, audio from movies and television shows, among other audio signals.

The system 120 may also be configured to determine a status of the external environment 100 of the user 110 based on one or more objects or changes within the external environment 100 of the user 110. For example, as illustrated in FIG. 1, the system 120 may determine a status of the external environment 100 as including a vehicle 130 based on the vehicle 130 being within a field of view 122, or more generally, within a field of detection, of the system 120 in the external environment 100.

The system 120 may be further configured to determine when to give an indication to the user 110 about the status of the external environment 100 based on one or more detection algorithms. Each detection algorithm may be configured to detect one or more conditions within the external environment. When a condition is detected by a detection algorithm, the system 120 may present an indication to the user 110 of the status of the environment 100. In some embodiments, the system 120 may present different indications to the user 110 based on the condition that is detected. Alternately or additionally, the system 120 may present the same indication to the user 110 for every condition detected or for some set of the conditions detected. The indications may be presented to the user 110 by altering the audio signal being presented to the user 110. Altering the audio signal presented to the user 110 may include reducing the volume of the audio signal, presenting a second audio signal along with the presented audio signal (e.g., a beep, a buzz, a message, an alarm, among other sounds), presenting a second audio signal that replaces the presented audio signal (e.g., a beep, a buzz, a message, an alarm, among other sounds), reducing noise cancellation to allow external audio signals to be presented along with the presented audio signal, or any combination thereof. In some embodiments, the indication presented to the user 110 may include one or more verbal words indicating the condition that exists.

In some embodiments, the conditions that may be detected by the detection algorithms based on the status of the environment 100 may relate to the safety of the user 110. For example, the detection algorithms may detect dangerous conditions for the user 110 within the environment 100. The dangerous conditions may exist based on the proximity, location, velocity, acceleration, and/or approach time of motorized vehicles, people, or other objects with respect to the user 110. For example, when the user 110 is running along a road while the system 120 is presenting the user 110 audio signals, such as music, the user 110 may not hear the approaching vehicle 130. The system 120 may include a condition to alert the user 110 when a vehicle comes or appears to be coming within a particular proximity of the user 110. When a detection algorithm within the system 120 determines that the condition has been satisfied based on the status of the environment 100, the system 120 may alter the audio signal presented to the user 110 to indicate to the user 110 that the condition has been detected, that is that the vehicle 130 is within the particular proximity to the user 110. The system 120 may alter the audio signal by overlying the already presented audio signal with a second audio signal, such as a verbal message that says "warning: car."

In some embodiments, the conditions that may be detected by the detection algorithms based on the status of the environment 110 may relate to the privacy of the user 110. For example, the detection algorithm may detect conditions when the privacy of the user 110 within the environment 100 may be compromised. The privacy of the user 110 may be compromised based on the proximity and location of other people with respect to the user 110. For example, when listening to an audio signal being presented by the system 120, the user 110 may not notice people behind the user 110. When a person comes within a particular proximity behind the user 110, the system 120 may alter the audio signal being presented to the user 110 to indicate that a person is behind the user 110 within the particular proximity. Indicating to the user 110 that a person is behind the user 110 may assist in protecting the privacy of the user 110. For example, a person within a room listening to music may not hear when another person enters the room. The system 120 may indicate to the person that the other person has entered the room by altering the audio signal being presented to the person.

In some embodiments, the detection of a condition by a detection algorithm may be based on one or more parameters. For example, a parameter for the condition of a vehicle coming or appearing to be coming within a particular distance of the user 110 may be a distance between the user 110 and the vehicle 130. Thus, based on the distance parameter, a vehicle within a certain distance of the user 110 may or may not fulfill the condition. In some embodiments, values for parameters for different conditions may be set by the user 110, set by the system 120 based on user 110 input, (e.g., the system 120 sets parameters based on responses to one or more questions that do not ask directly for the parameter value), or set by the system 120 based on other factors. In some embodiments, a value for a parameter may be selected based on an activity being performed by the user 110. For example, a proximity parameter may have a first value when the user 110 is walking, a second value when the user 110 is running, a third value when the user 110 is riding a bike, and a fourth value when the user 110 is remaining still. In some embodiments, the user 110 may indicate to the system 120 the activity being performed by the user 110. Alternately or additionally, the system 120 may apply activity recognition analysis to determine the activity being performed by the user 110.

An example of detection of a condition being based on at least two parameters may include detecting a condition based on both the velocity and proximity of the vehicle 130. For example, a proximity parameter may have a relatively small value when a velocity parameter has a relatively small value or a relatively large value when the velocity parameter has a relatively large value. Accordingly, the user 110 may have sufficient time to react to the approach of the vehicle 130, if desired, whether the vehicle is traveling at 50 miles-per-hour (mph) or 10 mph. Another way to express various combinations of proximity (e.g., distance) and velocity may be to use an approach time parameter. Because velocity and distance are related to time, e.g., according to the equation distance=velocity*time, a single approach time parameter may specify a condition that may be satisfied by any of a variety of combinations of velocity and proximity.

In some embodiments, conditions to be detected by the system 120 may be selected by the user 110. In these and other embodiments, the system 120 may allow the user 110 to select conditions that may be detected. Alternately or additionally, conditions to be detected by the system 120 may be based on an activity being performed by the user 110. For example, when the user 110 is performing a first activity, one or more first conditions may apply. When the user 110 is performing a second activity, one or more second conditions may apply.

Figure 2:
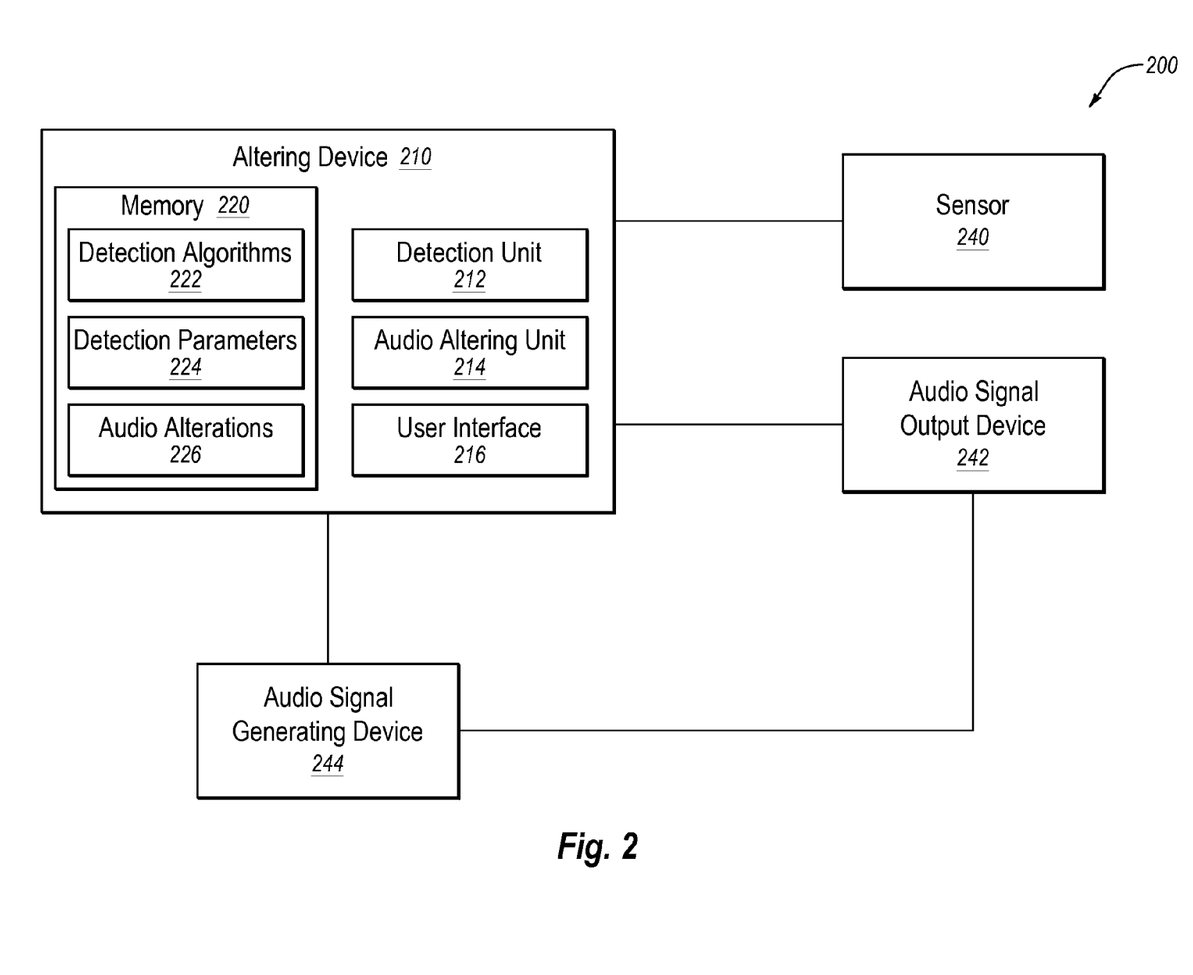
FIG. 2 is a block diagram of an example system of altering an audio signal presented to a user based on a status of an external environment.

FIG. 2 is a block diagram of an example system 200 of altering an audio signal presented to a user based on a status of an external environment, arranged in accordance with at least one embodiment described herein. The system 200 may include an altering device 210, a sensor 240, an audio signal output device 242, and an audio signal generating device 244.

The altering device 210 may be configured to detect when a condition occurs within an environment external to the system 200 based on data received from the sensor 240. When a condition is detected as occurring, the altering device 210 may be configured to send a signal to the audio signal generating device 244 and/or the audio signal output device 242 to alter an audio signal being presented to a user based on the detected condition.

The altering device 210 may include a detection unit 212, an audio altering unit 214, a user interface 216, and a memory 220. The memory 220 may include detection algorithms 222, detection parameters 224, and audio alterations 226.

The detection unit 212 may be configured to receive data indicating a status of an environment external to or outside of the system 200 from the sensor 240 at an input to the altering device 210. The data received from the sensor 240 may be an image, a video stream, or some other data form. The detection unit 212 may be configured to access one or more detection algorithms 222 within the memory 220 and apply the detection algorithms to the data received from the sensor 240 to detect one or more conditions associated with the corresponding detection algorithm(s) 222.

In some embodiments, the one or more detection algorithms 222 selected by the detection unit 212 may be based on conditions selected to be detected by a user of the system 200. In these and other embodiments, the altering device 210 may allow a user by way of the user interface 216 to select conditions to be detected. Each of the conditions selected by the user may be associated with one or more detection algorithms 222. The detection algorithms 222 associated with the selected conditions may be applied to the received data by the detection unit 212.

In some embodiments, the one or more detection algorithms 222 selected by the detection unit 212 for applying to the received data may be based on conditions selected to be detected by the detection unit 212. In these and other embodiments, the detection unit 212 may select the conditions and the appropriate detection algorithms 222 for the selected conditions. In some embodiments, the detection unit 212 may select the conditions based on an activity being performed by a user of the system 200. In some embodiments, the user of the system 200 may indicate the activity to the detection unit 212. Alternately or additionally, the detection unit 212 may determine the activity being performed by the user of the system 200 based on activity information generated by the system 200. Using the activity information (e.g., motion of the user gathered from sensors such as an accelerometer or other sensors, such as the sensor 240) the detection unit 212 may perform an activity recognition analysis to determine the activity being performed by the user of the system 200.

In some embodiments, the detection unit 212 may apply the one or more detection algorithms 222 to the data received from the sensor 240 based on the detection parameters 224. In these and other embodiments, the detection unit 212 may access one or more detection parameters 224 associated with the selected one or more detection algorithms 222 and based on the received data, the detection parameters 224, and the detection algorithms 222, the detection unit 212 may detect conditions within an environment external to system 200.

In some embodiments, values of the detection parameters 224 may be based on inputs received from a user of the system 200 by way of the user interface 216. Alternately or additionally, values of the detection parameters 224 may be based on other factors, such as the design of the system 200, the sensitivity of the sensor 240, the position of the sensor 240, the data received from the sensor 240, a physical location of the system 200, among others. For example, a value of a proximity parameter associated with a distance between a person and the user of the system 200 that is used in conjunction with a detection algorithm 222 used to detect dangerous situations may be set larger when the system 200 is currently located in a relatively safer neighborhood than when the system 200 is currently located in a relatively less safe neighborhood. As another example, a value of a proximity parameter associated with a distance between a person and the user of the system 200 that is used in conjunction with a detection algorithm 222 used to detect dangerous situations may be set larger when the sensor 240 senses that it is daytime than when the sensor 240 senses that it is nighttime.

In some embodiments, the one or more detection parameters 224 selected by the detection unit 212 may depend on an activity being performed by the user. For example, a value of a proximity parameter associated with a distance between a person and the user of the system 200 that is used in conjunction with a detection algorithm 222 used to detect dangerous situations may be set larger when the user is riding a bicycle than when the user is walking. In these and other embodiments, the detection unit 212 may receive an indication from the user of the system 200 of the activity being performed by the user through the user interface 216 or may determine the activity being performed as explained previously.

When the detection unit 212 detects a condition in the environment external to the system 200, the detection unit 212 indicates the condition to the audio altering unit 214. The audio altering unit 214 may be configured to determine how to alter an audio signal being presented to the user of the system 200. The audio altering unit 214 may select to alter the presented audio signal by adjusting a volume of the audio signal, presenting a second audio signal along with the presented audio signal (e.g., a beep, a buzz, a message, an alarm, among other audio signals), presenting a second audio signal that replaces the presented audio signal (e.g., a beep, a buzz, a message, an alarm, among other audio), reducing noise cancellation to allow external audio signals to be presented along with the presented audio signal, or any combination thereof.

In some embodiments, the audio altering unit 214 may determine how to alter the presented audio signals based on the audio alterations 226. Each condition that may be detected by the detection unit 212 may have an associated audio alteration 226. In some embodiments, each condition may have a different audio alteration 226, some conditions may share audio alterations 226, or all the conditions may have the same audio alteration 226. Based on the audio alteration 226 associated with the detected condition, the audio altering unit 214 may be configured to direct the altering of the presented audio signal. In particular, the audio altering unit 214 may direct the audio signal generating device 244 and/or the audio signal output device 242 to alter the presented audio signal based on the selected audio alteration 226. For example, when the audio alteration 226 is a message, the audio altering unit 214 may direct the audio signal generating device 244 to substitute a message in place of the presented audio signal. As another example, when the audio alteration 226 indicates to reduce volume and/or reduce noise cancelling, the audio altering unit 214 may direct the audio signal output device 242 to reduce volume and/or reduce noise cancelling.

In some embodiments, the audio altering unit 214 may perform other actions based on a condition detected in the external environment. For example, when a condition is detected that affects the personal safety of the user of the system 200; the audio altering unit 214 may be configured to record sounds in the external environment. Alternately or additionally, the audio altering unit 214 may be configured to direct that a communication be made for assistance to a government agency or some other group automatically or based on an input of a user. For example, when a condition is detected that the user may be subjected to a crime, the audio altering unit 214 may record audio for use in prosecuting the crime and may initiate a phone call to government authorities for assistance.

The sensor 240 may be configured to detect a status of an external environment. In particular, the sensor 240 may be configured to determine objects, such as people, vehicles, and other objects in the external environment. In some embodiments, the sensor 240 may be configured to constantly monitor the external environment to continually detect a status of the external environment and may send the status to the altering device 210. In these and other embodiments, the altering device 210 may continually detect conditions within the external environment or periodically detect conditions within the external environment. Alternately or additionally, the sensor 240 may periodically send the status of the external environment to the altering device 210. Alternately or additionally, the sensor 240 may periodically monitor the external environment. The sensor 240 may be an imaging sensor, an infrared sensor, a sonar sensor, or some other sensor. The sensor 240 may be communicatively coupled to the altering device 210 through a wire or wirelessly.

The audio signal generating device 244 may be configured to generate an audio signal from audio files, video files, communication data, or other data types. In some embodiments, the audio signal generating device 244 may alter the audio signal by generating a second audio signal based on audio files or other data types received from the audio altering unit 214.

The audio signal output device 242 may be one or more speakers or some other device configured to convert the audio signal from an electrical audio signal to an acoustical audio signal. The audio signal output device 242 may also be configured to determine the volume of the audio signal output to the user of the system 200. Alternately or additionally, the audio signal output device 242 may be configured to generate noise cancellation signals based on noise signals received from the external environment and to present the noise cancellation signals to the user of the system 200.

The memory 220 may include any suitable computer-readable media configured to retain program instructions and/or data for a period of time. By way of example, and not limitation, such computer-readable media may include tangible computer-readable storage media including random access memory (RAM), read-only memory (ROM), electrically erasable and programmable ROM (EEPROM), compact disc-ROM (CD-ROM) or other optical disk storage, magnetic disk storage or other magnetic storage devices, flash memory devices (e.g., solid state memory devices) or any other storage medium which may be used to carry or store desired program code in the form of computer-executable instructions or data structures and which may be accessed by modules in the altering device 210.

Modifications, additions, or omissions may be made to the system 200 without departing from the present disclosure. For example, the order of many operations may be different than described above. Additionally, the functions of one or more of the modules and/or other components listed above may be performed by other components or modules than those specifically listed and a single unit or component may perform the operations associated with more than one of the above described units and components. The different units and components are merely used to clarify the different operations that may be performed by the system 200. In some embodiments, the system 200 may include other units or components. For example, the system 200 may include additional sensors in addition to the sensor 240. In these and other embodiments, the sensor 240 and the additional sensors may each be different sensors or some of the sensors may be different sensors. The types of sensors deployed by the system 200 may depend on the operation of the system 200. For example, in some embodiments as noted, the system 200 may determine an activity of a user automatically based on sensor input. In these and other embodiments, the sensors that provide data to determine the activity of a user may be different or the same as the sensor that determines a status of the external environment.

Additionally, the different components of the system are illustrated as being separate components. In some embodiments, the different components of the system may be integrated into a single structure. For example, the system 200 may be contained in headphones that generate and play music. Alternately or additionally, one or more of the different components of the system 200 may be combined with other components. For example, the audio signal generating device 244 and the altering device 210 may be part of a mobile device, such as a smart phone, and the audio signal output device 242 and the sensor 240 may be part of headphones connected to the mobile device.

Figure 3:
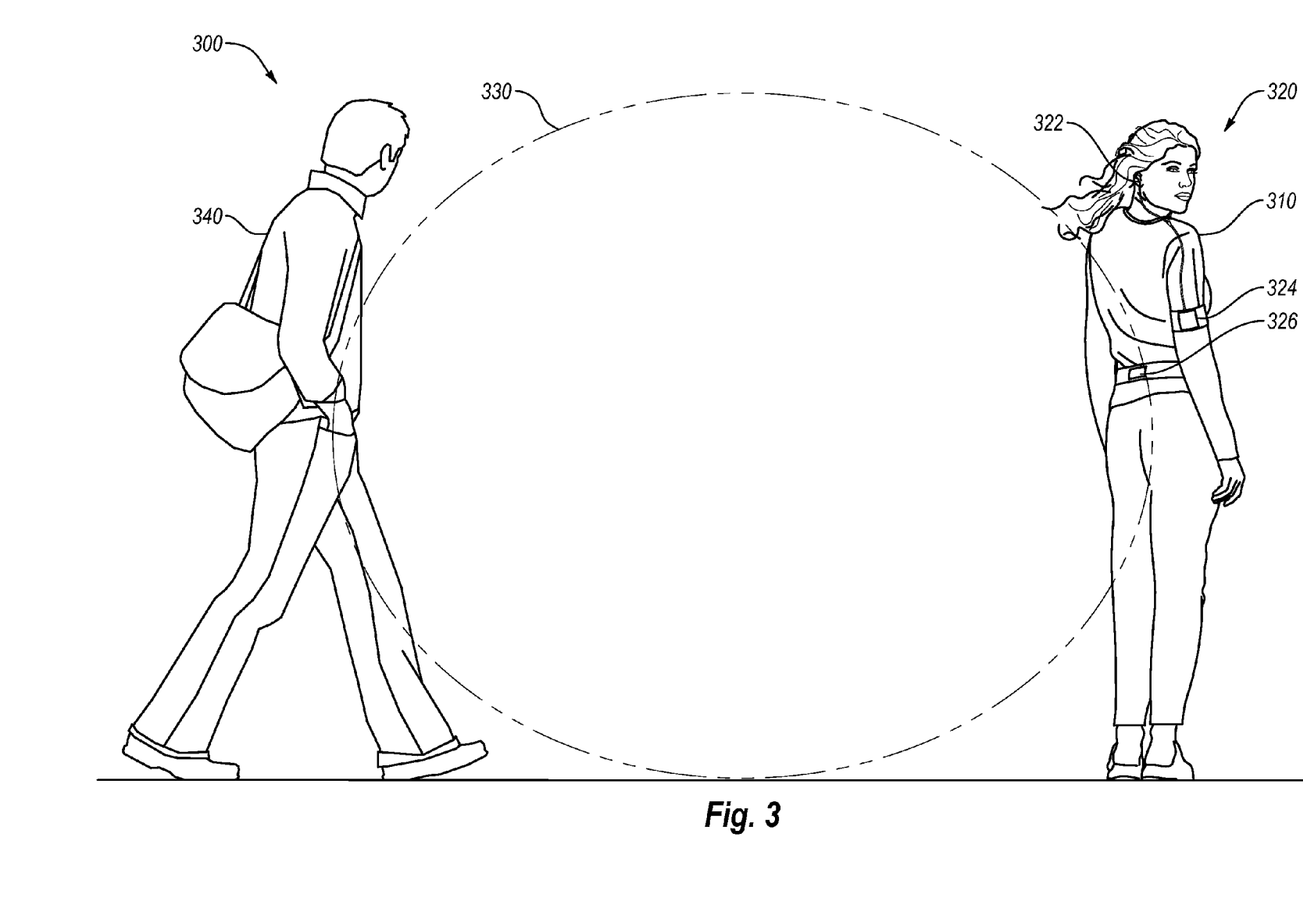
FIG. 3 illustrates an example system of altering an audio signal in an external environment.

FIG. 3 illustrates an example system 320 of altering audio signals in an external environment 300, arranged in accordance with at least one embodiment described herein. The system 320 may include headphones 322, an audio and detection unit 324, and a sensor 326. The system 320 may be configured to provide an audio signal to a user 310 and to alter the audio signal when a condition is detected to alert the user 310 of the detected condition. The system 320 is an example embodiment of the system 200 of FIG. 2.

The sensor 326 may be a camera and may send data indicating a status of the external environment 300 surrounding the user 310 to the audio and detection unit 324. In particular, the sensor 326 may send an image of an area behind the user 310. The audio and detection unit 324 may receive the data from the sensor 326 and may apply a detection algorithm to the data. In some embodiments, the detection algorithm may use processing techniques, such as image processing techniques, to determine if a person or vehicle is within a proximity zone 330 of the user 310. The proximity zone 330 of the user may be based on a value of a parameter received by the audio and detection unit 324 from the user 310. When the detection algorithm does not detect a person within the proximity zone 330, such as an individual 340 as illustrated in FIG. 3, the condition of a person or vehicle being in the proximity zone 330 is not met and the audio and detection unit 324 does not alter the audio signal presented to the user 310. When the detection algorithm does detect a person or vehicle, such as the individual 340, within the proximity zone 330, the condition of a person or vehicle being in the proximity zone 330 is met. When the condition of a person or vehicle being in the proximity zone 330 is met, the audio and detection unit 324 may alter the audio signal being communicated to the headphones 322, such as music, by combining the audio signal with a second audio signal such as a beep. The second audio signal may indicate to the user 310 that a person or vehicle is in the proximity zone 330 of the user 310.

In some embodiments, the audio and detection unit 324 may distinguish between objects in the proximity zone 330, such as between a vehicle, a person, or a person on a bicycle. In these and other embodiments, the audio and detection unit 324 may alter the audio signal differently based on the object in the proximity zone 330.

In some embodiments, the audio and detection unit 324 may alter the audio signal based on the number of objects, or the locations of the objects in the proximity zone 330. For example, a condition may be detected when only a single person is in the proximity zone 330 or when a group of people are detected in the proximity zone 330 but clustered in an area of the proximity zone 330. Alternately or additionally, the size of the proximity zone 330 used by the audio and detection unit 324 to detect a condition may vary based on an object in the environment 300. For example, the proximity zone 330 may be larger for vehicles than for an individual person.

Figure 4:
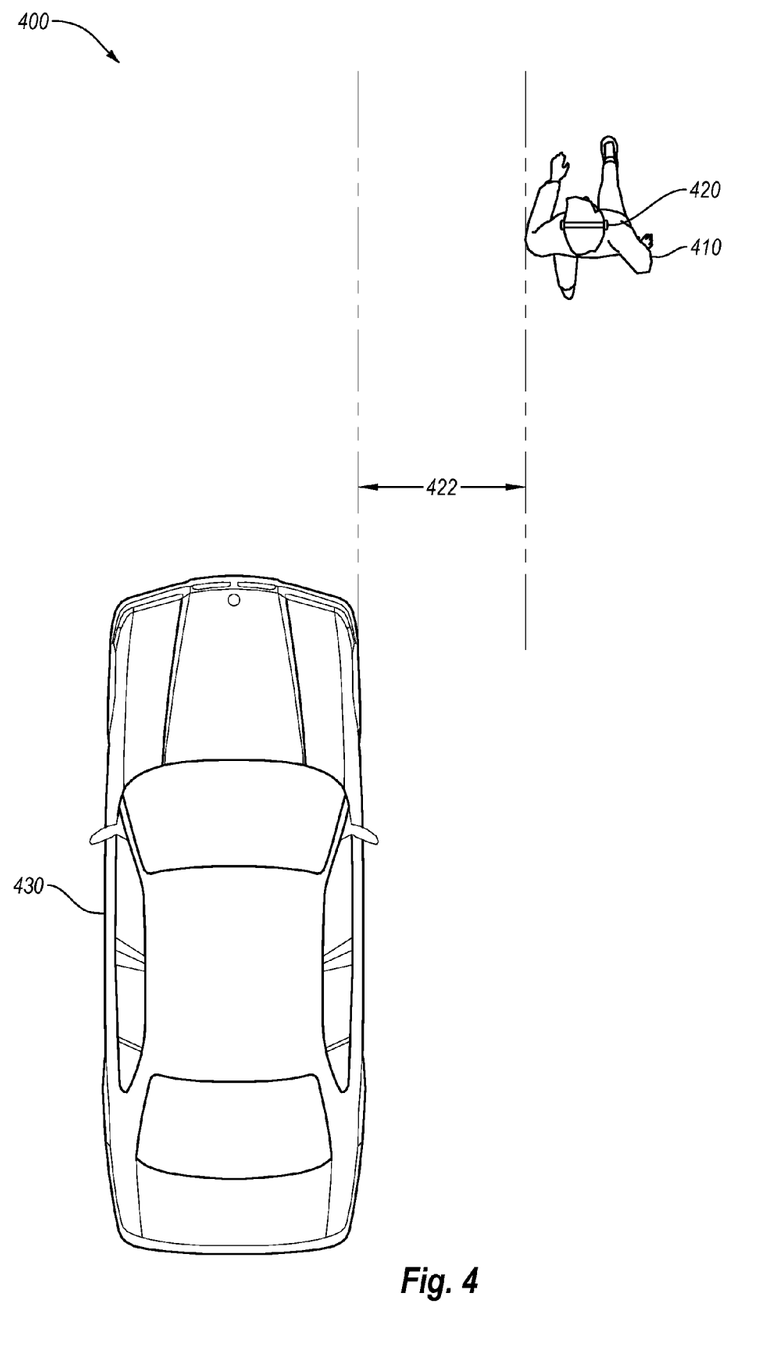
FIG. 4 illustrates another example system of altering an audio signal in another external environment.

FIG. 4 illustrates another example system 420 of altering audio signals in another external environment 400, arranged in accordance with at least embodiment described herein. The system 420 may be configured to provide an audio signal to a user 410 and to alter the audio signal when a condition is detected to alert the user 410 of the detected condition.

The system 420 may include a sensor configured to generate data indicating a status of the external environment 400 surrounding the user 410. The system 420 may apply one or more detection algorithms to the data generated by the sensor to detect one or more conditions associated with a vehicle 430 in the external environment 400. The system 420 is another example embodiment of the system 200 of FIG. 2.

In some embodiments, the sensor in the system 420 may be a camera and may be configured to generate images of the external environment 400. In these and other embodiments, the detection algorithms applied to the images may include image processing techniques to determine information about the vehicle 430.

For example, in some embodiments, a detectable condition may be the vehicle 430 traveling faster than a particular speed. The particular speed may be a parameter that is set by the user 410 or determined by the system 420 based on the location of the system 420. For example, when the system 420 is on a road with a speed limit of 25 miles per hour, a value of the parameter may be set at 30 miles per hour. When the vehicle 430 is traveling faster than 30 miles per hour, the condition related to speed may be detected and the system may alter the audio signals presented to the user 410 to alert the user 410 of the speed of the vehicle 430.

In some embodiments, a detectable condition may be a flashing blinker of the vehicle 430. The flashing blinker may indicate that the vehicle 430 may be turning and may have the potential to collide with the user 410.

In some embodiments, a detectable condition may be a distance 422 between the vehicle 430 and the user 410. The distance 422 may be a parameter that is set by the user 410 or determined by the system 420. In some embodiments, a value of the parameter for the distance 422 may be determined based on an activity being performed by the user 410. For example, the value of the parameter may be less when the user 410 is riding a bicycle than when the user 410 is walking.

In FIG. 4, the distance 422 is illustrated as a minimum distance between parallel (or anti-parallel) paths of the user 410 and the vehicle 430. More generally, the distance 422 may be any distance detectable by the system 420.

Figure 5:
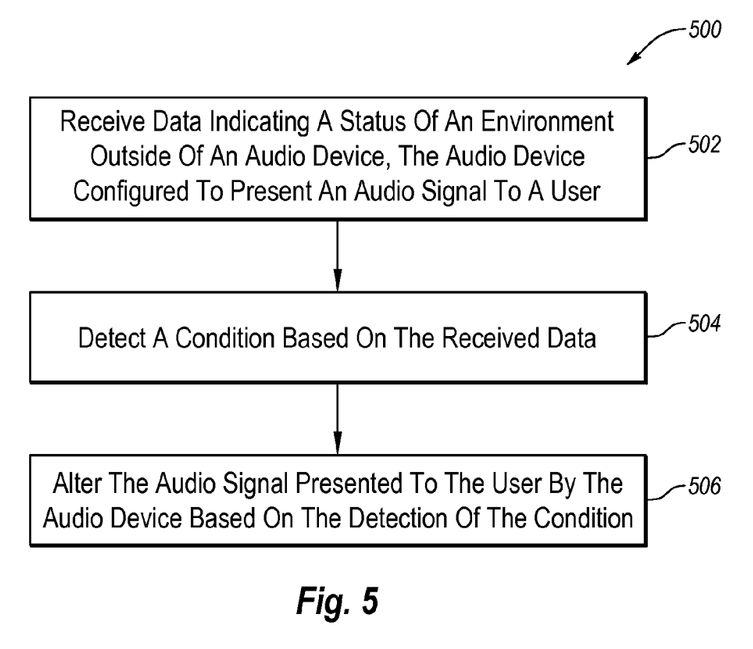
FIG. 5 is a flow chart of an example method of altering an audio signal presented to a user based on a status of an external environment.

FIG. 5 is a flow chart of an example method 500 of altering an audio signal presented to a user based on a status of an external environment, arranged in accordance with at least one embodiment described herein. The method 500 may be implemented, in some embodiments, by an audio altering system, such as the system 200 for altering audio signals of FIG. 2. Although illustrated as discrete blocks, various blocks may be divided into additional blocks, combined into fewer blocks, or eliminated, depending on the desired implementation.

The method 500 may begin at block 502, where data indicating a status of an environment outside of an audio device may be received. In these and other embodiments, the audio device may be configured to present an audio signal to a user. In some embodiments, the audio device may be included in or may be a headphone, a mobile phone, a gaming console, a music player, among other devices.

In block 504, a condition based on the received data may be detected. In some embodiments, detecting the condition may be further based on a parameter. In these and other embodiments, the parameter may be determined based on an activity being performed by the user. In some embodiments, a value of the parameter may be selected by the user or may be a preselected or default value.

In block 506, the audio signal presented to the user may be altered based on the detection of the condition. In some embodiments, altering the audio signal presented to the user may include one or more of: reducing volume of the audio signal, presenting a secondary audio signal to the user, and reducing noise cancellation functionality of the audio device.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 500 may further include selecting a condition to detect based on an activity being performed by the user. In some embodiments, the activity being performed by the user may be detected by the audio device or may be selected by the user.

The method 500 may further include receiving, from the user, a response to the altering of the audio signal and sending an indication to an outside system of the detected condition based on the response from the user.

The embodiments described herein may include the use of a special purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may comprise tangible computer-readable storage media including RAM, ROM, EEPROM, CD-ROM or other optical disk storage, magnetic disk storage or other magnetic storage devices, or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A system of altering an audio signal presented to a user, the system comprising:
   an input configured to:
      receive first data from a camera providing a view of an environment outside of an audio device, the audio device configured to present an audio signal to a user;
      receive second data from a second sensor; and
      receive third data from the camera after receiving the first data and the second data;
   a detection unit configured to:
      detect an activity being performed by the user of the audio device based on the second data;
      detect a lighting value based on ambient light in the environment outside the audio device based on the first data;
      select a condition from a plurality of conditions based on the selected condition being associated with the detected activity and being associated with the lighting value, wherein each of the conditions of the plurality of conditions being different and being associated with at least one user activity and at least one lighting value, wherein different lighting values and different user activities result in selection of different ones of the plurality of conditions and each of the conditions is detected based on a different status of the environment outside the audio device; and
      detect the selected condition based on the received third data; and
   an audio altering unit configured to direct altering of the audio signal presented to the user by the audio device based on the detection of the selected condition.

2. The system of claim 1, wherein the altering of the audio signal presented to the user includes one or more of: reducing volume of the audio signal, presenting a secondary audio signal to the user, and reducing noise cancellation functionality of the audio device.

3. The system of claim 1, further comprising an audio output device coupled to the audio device and configured to present the audio signal to the user.

4. The system of claim 1, wherein the system includes a headphone, a pair of headphones, a mobile phone, a gaming console, and/or a music player.

5. The system of claim 1, wherein the detection unit is further configured to select a location value in accordance with a location of the audio device, wherein the condition is selected from the plurality of conditions based on the location value and the detected activity, wherein a change in the location value results in selection of a different condition of the plurality of conditions.

6. The system of claim 1, wherein the system includes the audio device.

7. The system of claim 1, wherein the audio altering unit is further configured to direct recording of sounds of the environment outside of the audio device after and in response to the detection of the selected condition.

* * * * *